United States Patent
Hirai et al.

(10) Patent No.: US 9,190,505 B2
(45) Date of Patent: Nov. 17, 2015

(54) FIELD EFFECT TRANSISTOR WITH CHANNEL CORE MODIFIED FOR A BACKGATE BIAS AND METHOD OF FABRICATION

(71) Applicant: Renesas Electronics Corporation, Kawasaki-shi (JP)

(72) Inventors: Tomohiro Hirai, Kawasaki (JP); Toshiharu Nagumo, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 79 days.

(21) Appl. No.: 14/134,747

(22) Filed: Dec. 19, 2013

(65) Prior Publication Data

US 2014/0183452 A1 Jul. 3, 2014

Related U.S. Application Data

(60) Provisional application No. 61/746,991, filed on Dec. 28, 2012.

(51) Int. Cl.
| | |
|---|---|
| *H01L 29/06* | (2006.01) |
| *H01L 29/775* | (2006.01) |
| *H01L 29/66* | (2006.01) |
| *H01L 29/78* | (2006.01) |
| *H01L 29/778* | (2006.01) |
| *H01L 29/10* | (2006.01) |
| *B82Y 10/00* | (2011.01) |

(Continued)

(52) U.S. Cl.
CPC .............. *H01L 29/775* (2013.01); *B82Y 10/00* (2013.01); *H01L 29/1087* (2013.01); *H01L 29/42392* (2013.01); *H01L 29/66439* (2013.01); *H01L 29/66795* (2013.01); *H01L 29/778* (2013.01); *H01L 29/785* (2013.01); *H01L 29/78648* (2013.01); *H01L 29/78696* (2013.01); *H01L 29/0673* (2013.01)

(58) Field of Classification Search
CPC ................... H01L 29/78648; H01L 29/42392; H01L 29/78696; H01L 29/785; H01L 29/66795; H01L 29/775; H01L 29/66439; H01L 29/1087; H01L 29/778; H01L 29/0673; H01L 29/0665; B82Y 10/00
USPC ............................................. 257/24; 438/283
See application file for complete search history.

(56) References Cited

U.S. PATENT DOCUMENTS 7,834,264 B2 * 11/2010 Majumdar et al. ............ 136/230
7,843,126 B2 * 11/2010 Ahn et al. ...................... 313/504

(Continued)

OTHER PUBLICATIONS

Electrical Characterizations of InGaAs Nanowire-Top-Gate Field-Effect Transistors by Selective-Area Metal Organic Vapor Phase Epitaxy, J. Noborisaka et al 2007 Jpn. J. Appl. Phys. 46 7562.*

(Continued)

*Primary Examiner* — Jami M Valentine
(74) *Attorney, Agent, or Firm* — McGinn IP Law Group, PLLC

(57) ABSTRACT

A semiconductor device includes a substrate and a source structure and a drain structure formed on the substrate. At least one nanowire structure interconnects the source structure and drain structure and serves as a channel therebetween. A gate structure is formed over said at least one nanowire structure to provide a control of a conductivity of carriers in the channel, and the nanowire structure includes a center core serving as a backbias electrode for the channel.

7 Claims, 11 Drawing Sheets

(51) Int. Cl.
*H01L 29/423* (2006.01)
*H01L 29/786* (2006.01)

(56) References Cited

U.S. PATENT DOCUMENTS

| | | | |
|---|---|---|---|
| 7,863,625 B2 * | 1/2011 | Bratkovski et al. | 257/80 |
| 7,906,778 B2 | 3/2011 | Kobayashi et al. | |
| 7,948,050 B2 | 5/2011 | Appenzeller et al. | |
| 8,063,450 B2 | 11/2011 | Wernersson et al. | |
| 8,110,458 B2 | 2/2012 | Jin et al. | |
| 8,173,993 B2 | 5/2012 | Bangsaruntip et al. | |
| 2002/0172820 A1 * | 11/2002 | Majumdar et al. | 428/357 |
| 2003/0089899 A1 | 5/2003 | Lieber et al. | |
| 2005/0275010 A1 | 12/2005 | Chen et al. | |
| 2008/0030838 A1 | 2/2008 | Moselund et al. | |
| 2008/0191196 A1 * | 8/2008 | Lu et al. | 257/27 |
| 2010/0200835 A1 | 8/2010 | Jin et al. | |
| 2011/0012090 A1 | 1/2011 | Singh et al. | |
| 2011/0018065 A1 | 1/2011 | Curatola et al. | |
| 2011/0278539 A1 | 11/2011 | Bangsaruntip et al. | |
| 2011/0315950 A1 | 12/2011 | Sleight et al. | |
| 2012/0068150 A1 | 3/2012 | Bangsaruntip et al. | |
| 2012/0217479 A1 | 8/2012 | Chang et al. | |

OTHER PUBLICATIONS

Ru Huang, "Self-Heating Effect and Variability in Gate-All Around (GAA) Silicon Nanowire Transistors (SNWT)" Dec. 8, 2010, pp. 1-10.

* cited by examiner

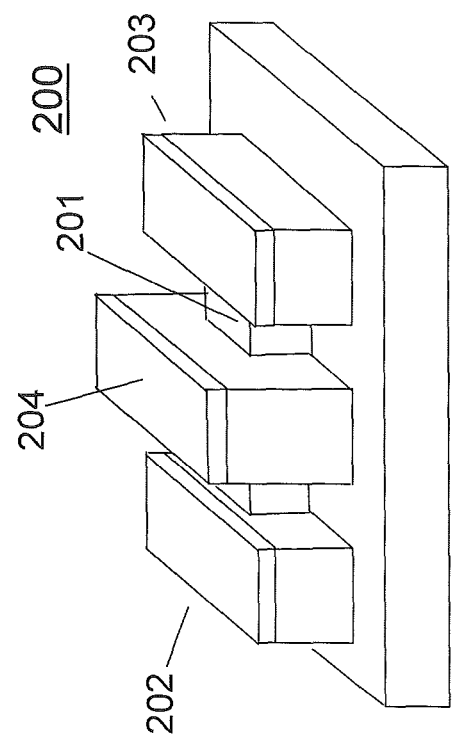
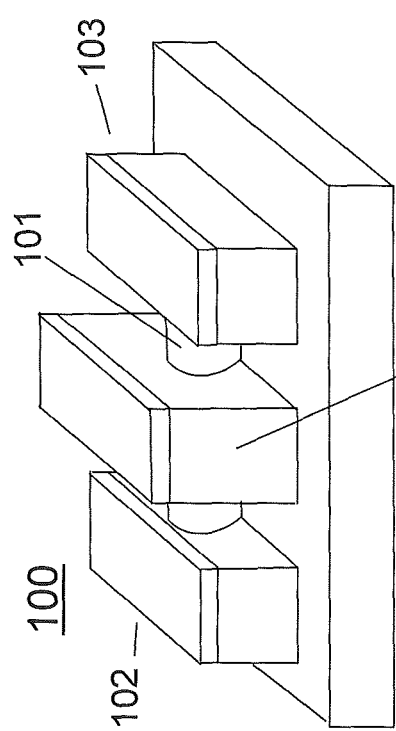
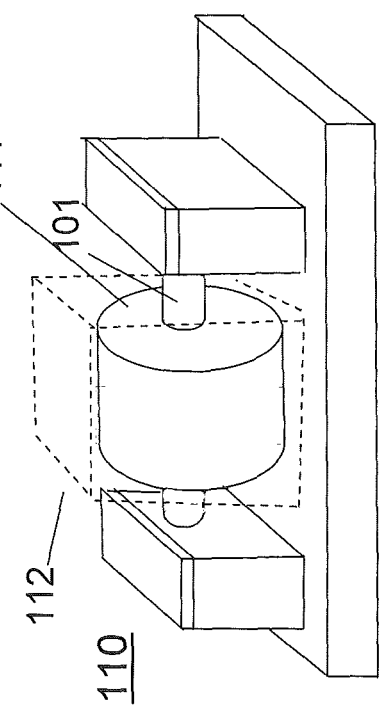
FIGURE 1
FIGURE 1A
FIGURE 2

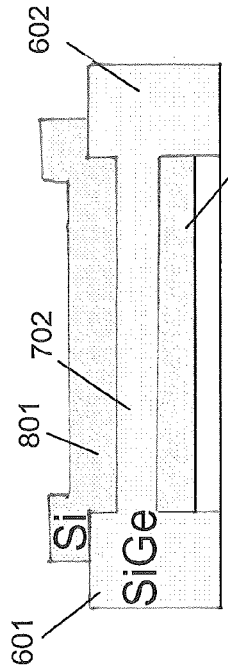
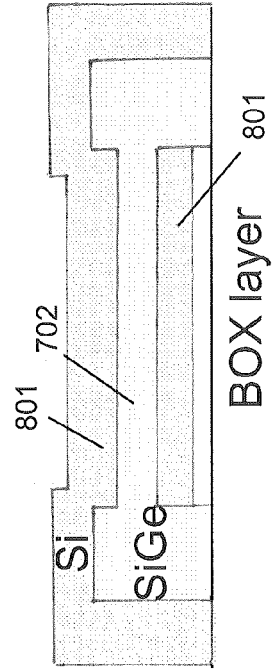
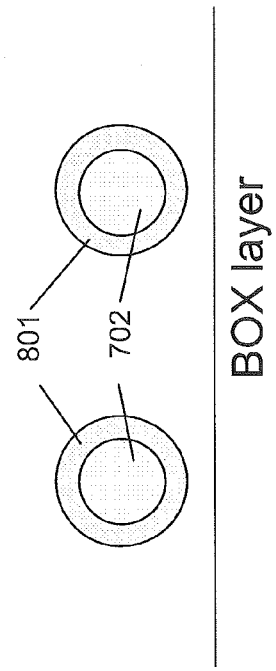
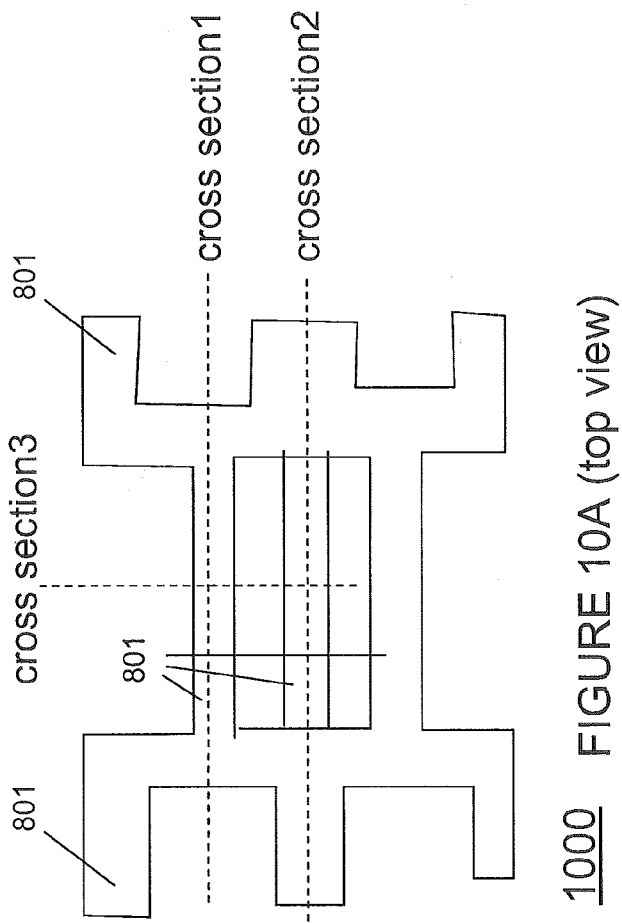
FIGURE 10B (cross section1)
FIGURE 10C (cross section2)
FIGURE 10D (cross section3)
FIGURE 10A (top view)

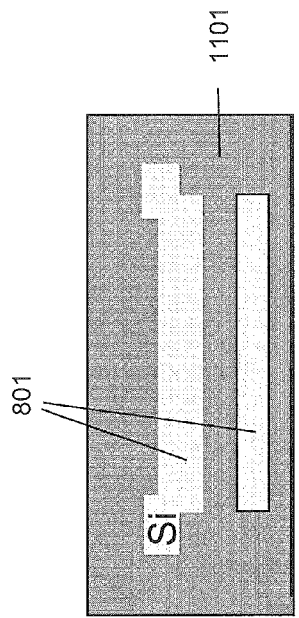
FIGURE 11B (cross section1)
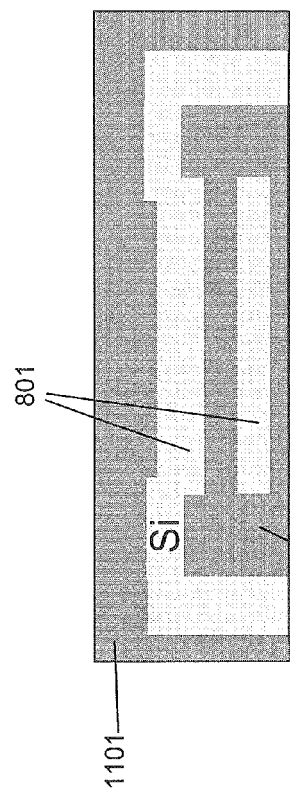
FIGURE 11C (cross section2)
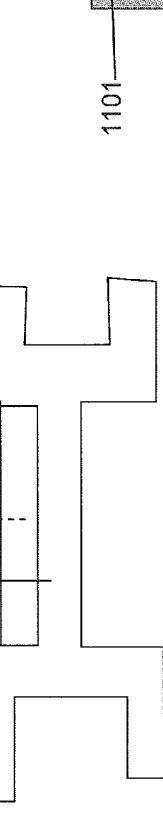
1100    FIGURE 11A (top view)
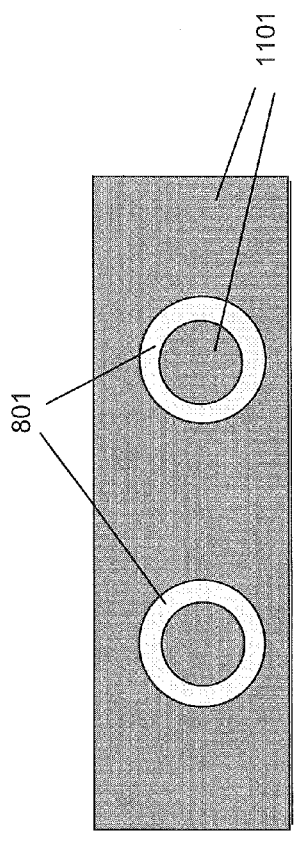
FIGURE 11D (cross section3)

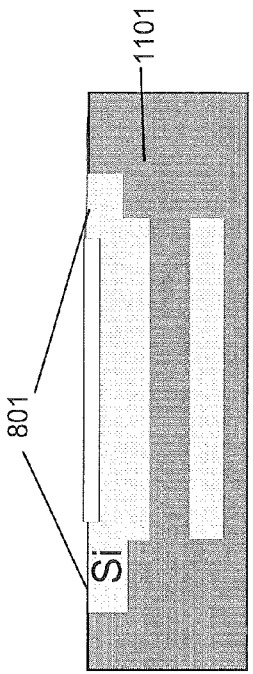
FIGURE 12B (cross section1)
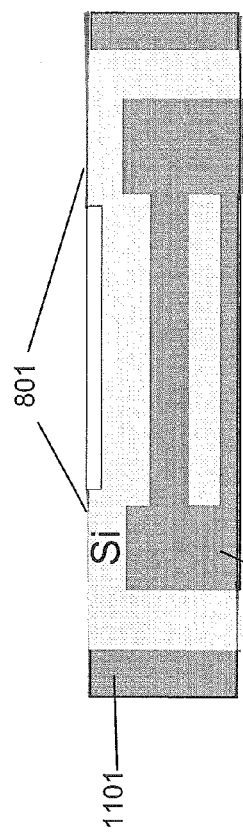
FIGURE 12C (cross section2)
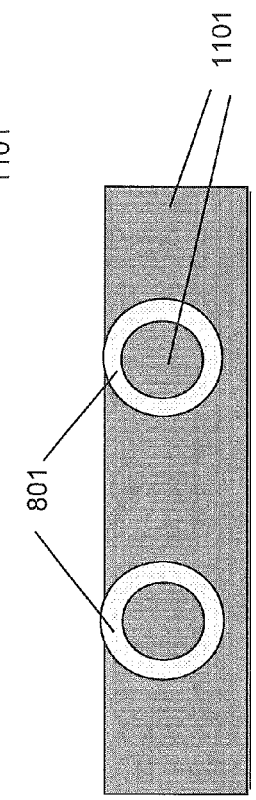
FIGURE 12D (cross section3)
1200 FIGURE 12A (top view)

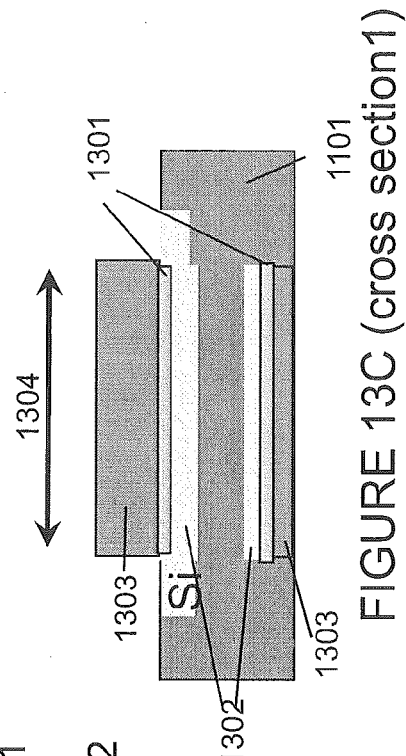
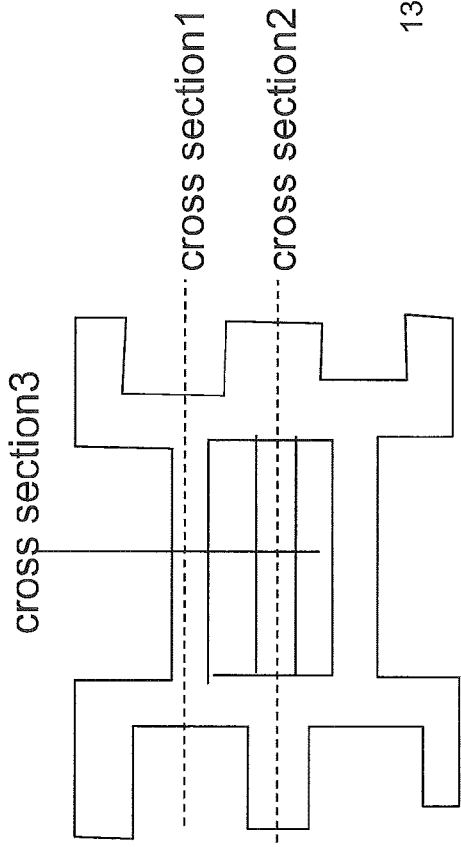
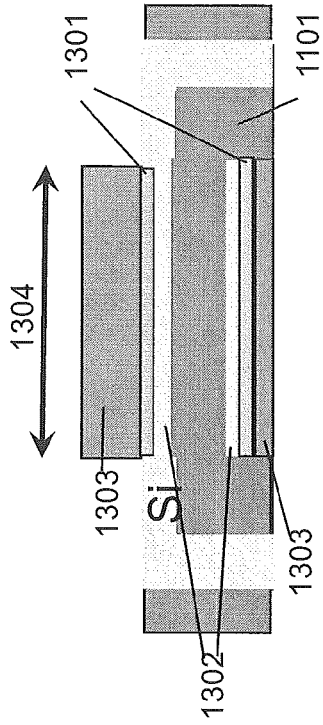
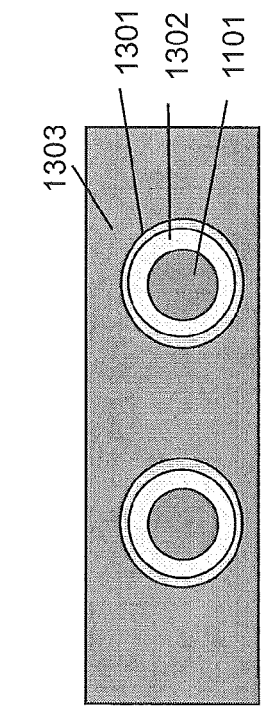
1300 FIGURE 13A (top view)
FIGURE 13B (cross section3)
FIGURE 13C (cross section1)
FIGURE 13D (cross section2)

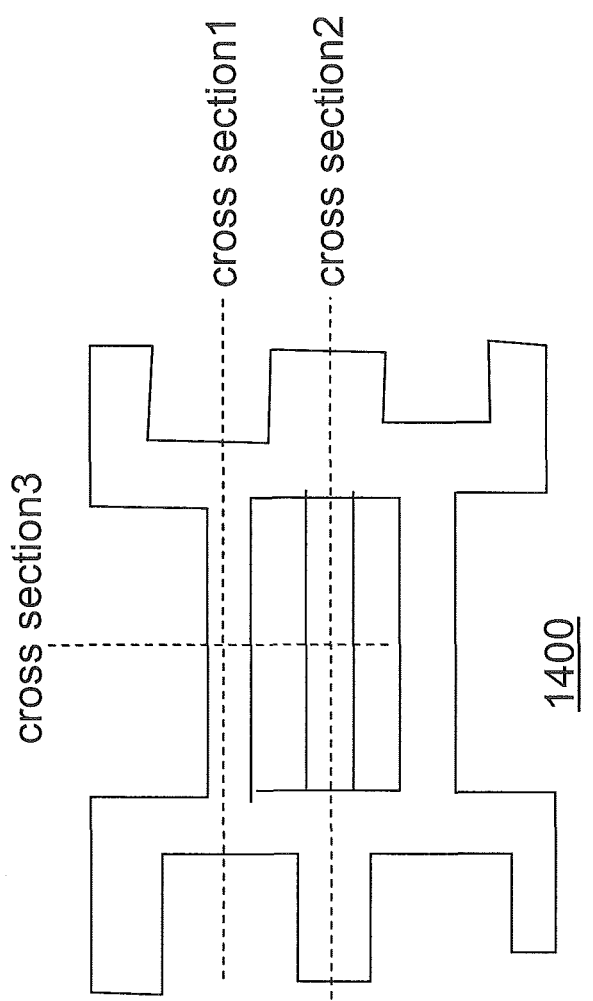

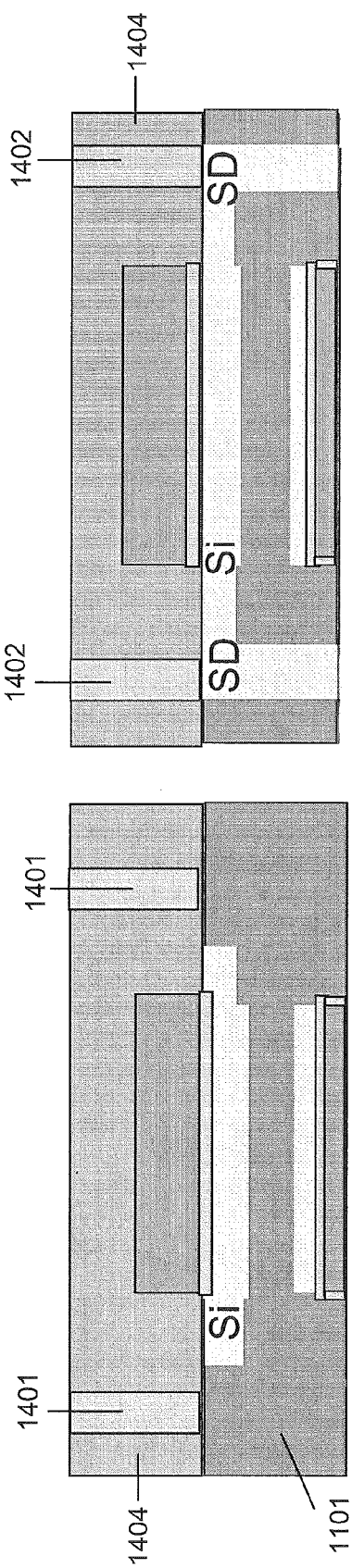
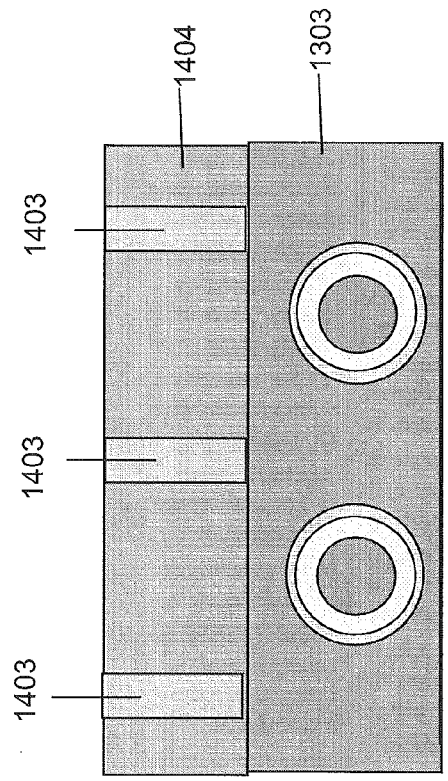
FIGURE 14B (cross section1)
FIGURE 14C (cross section2)
FIGURE 14D (cross section3)

US 9,190,505 B2

FIELD EFFECT TRANSISTOR WITH CHANNEL CORE MODIFIED FOR A BACKGATE BIAS AND METHOD OF FABRICATION

This Application is a Non-Provisional Application of Provisional Application No. 61/746,991, filed on Dec. 28, 2012, and claims priority thereto.

BACKGROUND OF THE INVENTION

1. Field of the Invention

The present invention relates generally to a NanoWire Field Effect Transistor (NWFET) or a finFET in which a channel core is modified to incorporate a feature for controlling threshold voltage. More specifically, the core of the nanowire channel of the NWFET or the core of the fin of the finFET is filled with an electrode material to which can be applied a backbias voltage.

2. Description of the Related Art

A recent trend in integrated circuit (IC) design is the use of nanowire transistors. FIG. 1 shows exemplarily a conventional nanowire field effect transistor (NWFET) configuration 100, wherein the nanowire 101 serves as the channel interconnecting the source 102 and drain 103. The gate 104 serves to control conductivity of the channel nanowire 101.

As shown in FIG. 1A, a gate-all-around nanowire FET 110 has a gate structure 111 that encircles the nanowire 101, as then further covered by a doped polysilicon structure 112. An example of a gate-all-around nanowire FET is described in U.S. Pat. No. 8,173,993 to Bangsaruntip, et al., the contents of which is incorporated herein by reference.

FIG. 2 shows exemplarily a conventional finFET 200, wherein the fin 201 serves as the channel interconnecting the source 202 and drain 203, with gate 204 serving to control the channel conductivity. Unlike the fin of the finFET, the nanowire channel of the NWFET 100 is typically roughly circular in cross-sectional view and is typically supported to be above the substrate, as exemplarily shown in FIG. 1A.

To optimize chip performance and leakage, multi-Vt technology is used, wherein different devices have different Ion/Ioff due to their different Vts.

However, particularly with the miniaturization of electronic devices, as exemplified by the use of NWFETs and finFETs and using conventional fabrication methods, it is difficult to achieve multiple Vt's for NWFETs and finFETs without increasing transistor variability.

That is, as exemplarily shown in FIG. 3, the conventional planar device receives an impurity implant in a planar manner so as to achieve a uniform impurities profile 301. In contrast, in a nanowire/finFET device 310, the implantation of a channel region 311 is non-planar, so that the non-uniform impurities profile can result in transistor variability 312 at the region surrounded by the gate dielectric layer and the gate layer (G).

SUMMARY OF THE INVENTION

In view of the foregoing and other exemplary problems, drawbacks, and disadvantages of the conventional methods and systems, an exemplary feature of the present invention is to provide a structure and method of fabrication of NWFETs and finFETs having a feature that the core of the NWFET or finFET has an electrode configured for application of a backbias voltage, thereby providing a mechanism by which threshold voltage can be controlled.

In a first exemplary aspect of the present invention, described herein is semiconductor device, including a substrate; a source structure and a drain structure formed on the substrate; at least one nanowire structure interconnecting the source structure and drain structure and serving as a channel therebetween; and a gate structure formed over the at least one nanowire structure, to provide a control of a conductivity of carriers in the channel, and the nanowire structure includes a center core serving as a backbias electrode for the channel.

In a second exemplary aspect, also described herein is a semiconductor device, including a substrate; a source structure and a drain structure formed on the substrate; at least one interconnect structure interconnecting the source structure and the drain structure and serving as a channel therebetween; and a gate structure formed over the at least one interconnect structure to provide a control of a conductivity of carriers in the channel, wherein each of the at least one interconnect structure includes a center core serving as a backbias electrode for the channel.

In a third exemplary aspect, also described herein is a method of fabricating a semiconductor device, the method including forming a source structure and a drain structure on a substrate; forming at least one interconnect structure interconnecting the source structure and the drain structure, the at least one interconnect structure serving as a channel therebetween; and forming a gate structure over the at least one interconnect structure to provide a control of a conductivity of carriers in the channel, wherein each of the at least one interconnect structure includes a center core serving as a backbias electrode for the channel.

Other aspects, features and advantages of the invention will be more fully apparent from the ensuing disclosure and appended claims.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1 exemplarily shows a conventional NWFET 100;

FIG. 1A exemplarily shows a conventional NWFET with gate structure 111 encircling the nanowire 101 to provide a gate-all-around configuration 110;

FIG. 2 exemplarily shows a conventional finFET 200;

FIGS. 10A-10D illustrates in top and cross sectional views the fabrication stage 1000 in which the SiGe core in the nanowire structure is to be etched out by a wet etching process, from the two ends of the nanowire structure, given that the SiGe material can be selectively etched faster than the Si material;

FIGS. 11A-11D show top and cross sectional views after the electrode material deposition;

FIGS. 12A-12D show top and cross sectional views for a fabrication stage 1200 in which the source/drain portions are exposed by polishing;

FIGS. 13A-13D show top and cross sectional views for a fabrication step in which the gate structure is added using conventional MOS techniques; and FIGS. 14A-14D show top and cross sectional view for the final fabrication stage 1400 including contacts for the source/drain and backbias electrode.

DETAILED DESCRIPTION OF EXEMPLARY EMBODIMENTS OF THE INVENTION

Figure 3:
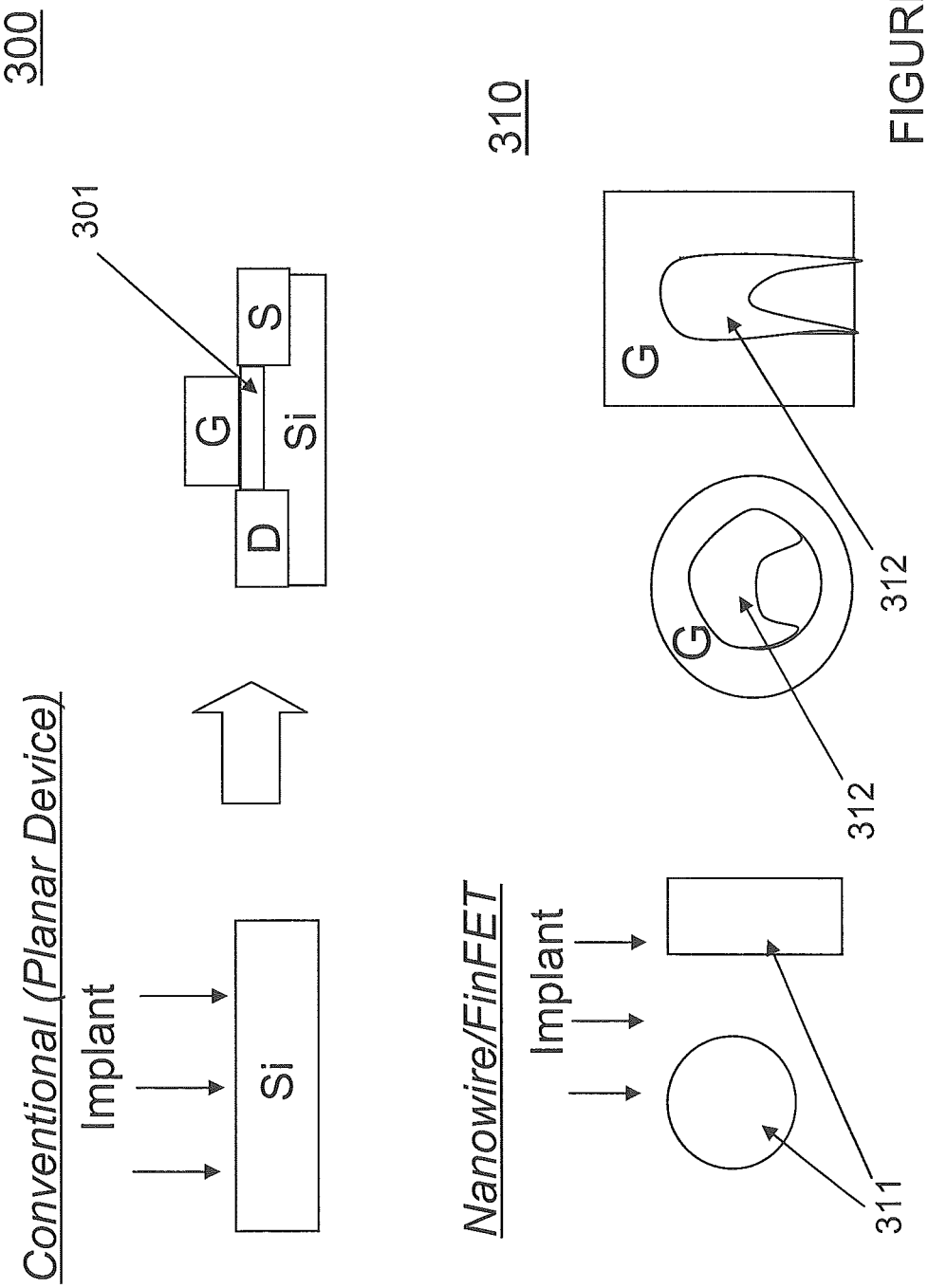
FIG. 3 illustrates the non-uniform implant characteristics 311 of nanowire/finFETs 310, compared with the uniform implant characteristics 301 of planar devices 300.

Referring now to the drawings, and more particularly to FIGS. 4-14D, exemplary embodiments of the method and structures of the present invention will now be explained.

Figure 4:
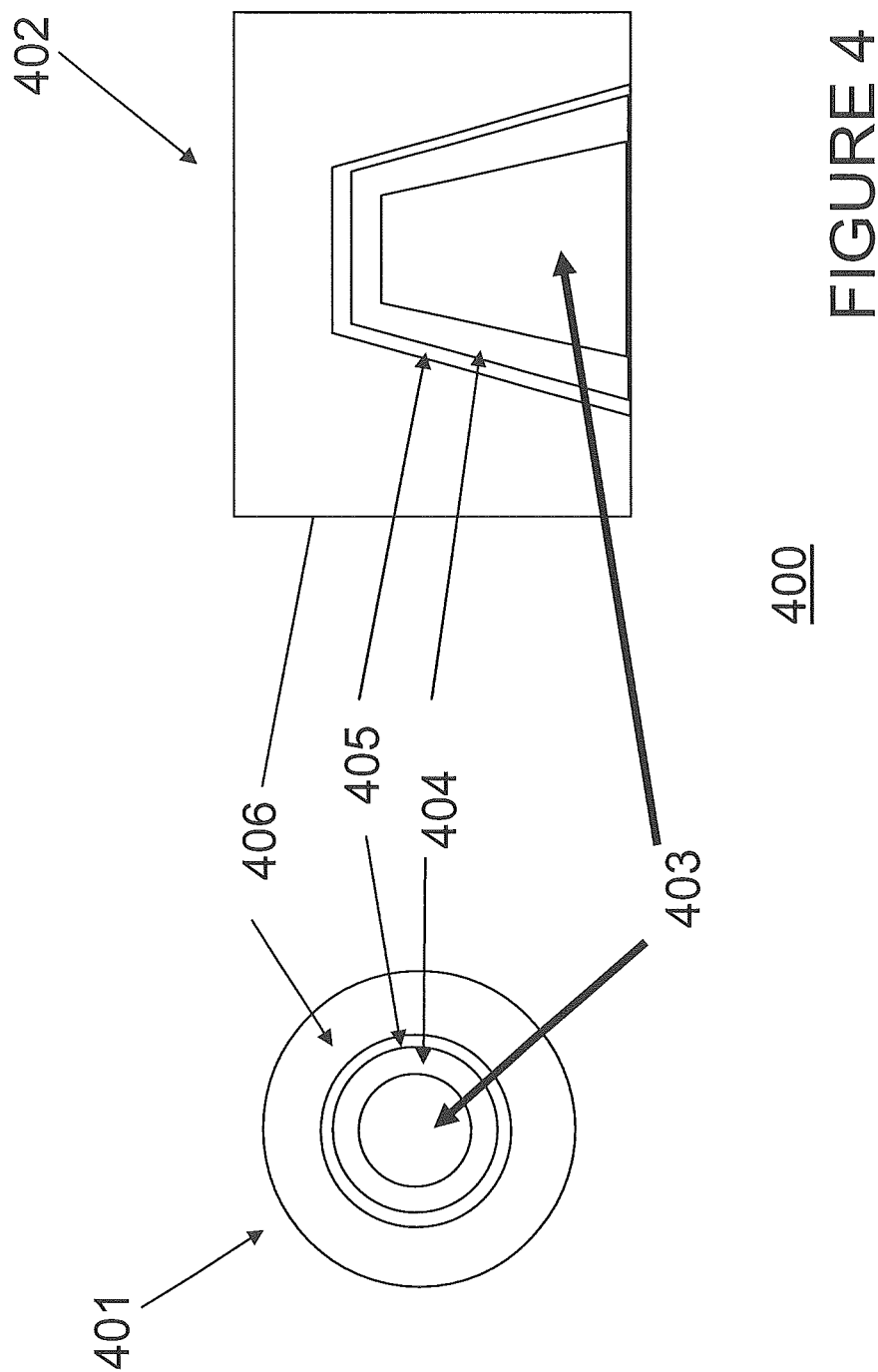
FIG. 4 illustrates a cross-sectional view 400 of a nanowire structure 401 and fin structure 402 of exemplary embodiments of the present invention, demonstrating the backbias electrode core 403.

To begin, FIG. 4 exemplarily illustrates a cross-sectional view 400 of a nanowire channel 401 of an NWFET or fin 402 of a finFET of the present invention, as modified to incorporate an electrode material, such as polysilicon, as used herein to explain an exemplary embodiment of the present invention, as a core 403 of a channel 404, surrounded by a gate dielectric layer 405, which, in turn, is surrounded by the gate structure including, for example, a layer of metal 406 and/or a layer of doped polysilicon. As typical with conventional nanowire channel devices, the channel 404 would typically be comprised of Si, SiGe, or Si/SiGe.

However, instead of polysilicon, other materials such as the metal tungsten (W) can also be used for the backbias electrode, as long as it at can be inserted into a nanowire in the mechanism described herein. The present inventor has realized that threshold voltage of a nano-channel device of the conventional NWFET or finFET can desirably be stabilized by recognizing that a back-biasing mechanism could provide a means to more precisely control for a desired threshold voltage for each device.

In accordance with an exemplary aspect of the present invention, this back-biasing mechanism of the present invention consists of incorporating a center core inside the channel core of the NWFET or finFET that can provide a back-biasing effect.

Figure 5:
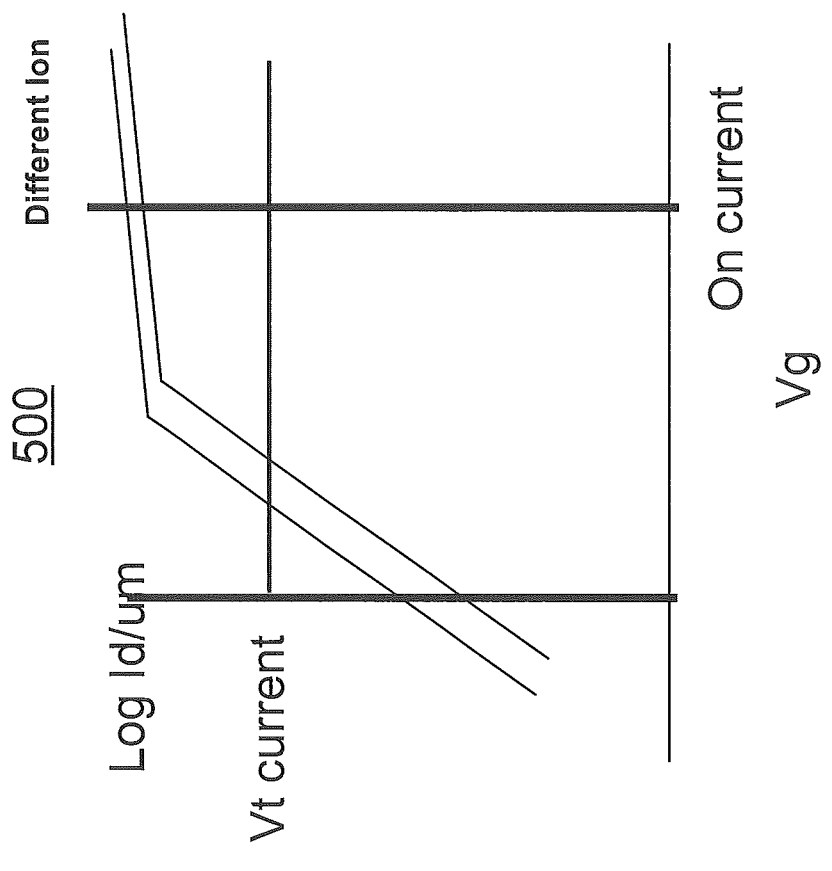
FIG. 5 provides an exemplary characteristic curve 400 that demonstrates the effects of the electrode core 403 provided by the present invention.

The device characteristic curve 500 in FIG. 5 exemplarily shows the improved back-bias effects of the present invention. The horizontal axis is gate voltage Vg and the vertical axis is the logarithmic scale for current per micrometer length of the channel length (Id/µm). Threshold voltage Vt is clearly affected when different back-bias voltages are applied to the core electrode.

FIGS. 6-14D demonstrate exemplary fabrication steps for a device implementing the concepts of the present invention, as shown for an NWFET. One having ordinary skill in the art would recognize that the fabrication of a finFET would have correspondingly similar fabrication steps, with the fin of the finFET being operated on in a similar manner as described below for an NWFET, so these fabrication steps should be considered as additionally demonstrating the fabrication steps of a finFET except that the nanowire modifications would correspond to similar modifications of the fin structure.

Figure 6:
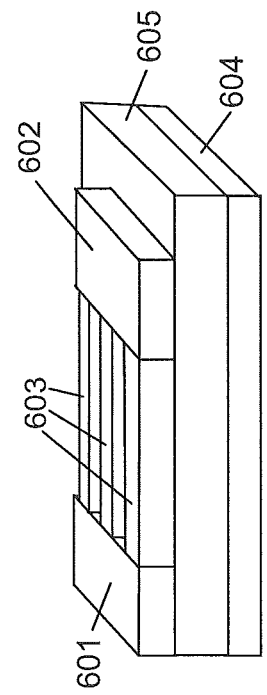
FIG. 6 illustrates an initial nanowire formation stage 600 of an exemplary embodiment of the present invention.

In a fabrication stage 600 shown exemplarily in FIG. 6, a first base portion 601, a second base portion 602, and third base portions 603 are formed on a substrate 604 using, for example, a deposition of Si, SiGe, or Si/SiGe. The substrate 604 itself is not critical and could be any conventional substrate, including, for example, a silicon wafer or a silicon-on-insulator (SOI) structure exemplarily shown in FIG. 6, wherein the upper layer 605 comprises a buried oxide (BOX) layer on top of a silicon layer 604. The first and second base portions 601, 602 will ultimately serve as the basis for the source and drain for the device, and the third base portions 603 will serve as the basis for the cores of the device channel.

In an exemplary fabrication method of the present invention and as will be clear from the following description, selective etching will be used to selectively remove portions of the device during fabrication, exemplarily using a wet etching or RIE (reactive-ion etching), including being able to selectively etch out the core of the nanowire from the ends of the core. Accordingly, the selection of materials for the substrate and the base portions will require consideration of achieving different etching characteristics, so that material depositions will be designed to achieve the structure described herein.

As a non-limiting example, since the core of the nanowire is to be etched to leave behind the surrounding channel portion, a possible combination of channel/core materials would be $Si(1-x)Ge(x)/Si(1-y)Ge(y)$, where x, y are atomic %. The channel could be Si70% Ge30% and the core could be Si50% Ge50%, since, generally speaking, the higher Ge concentration means the faster the RIE rate.

Another factor to consider in material deposition is the doping of the deposited materials, since different doping could assist in getting different wet RIE rates. Additionally, doping could be used to achieve different threshold voltages Vt.

One of ordinary skill in the art will be able to select specific material compositions and doping once the remaining structure and fabrication is explained in the following discussion.

In the exemplary embodiment used for describing the present invention, the material exemplarily used for the first, second, and third base portions 601, 602, 603 is SiGe, since portions of this material will be subsequently selectively etched away, including etching of the third base portions from via their two ends, as will be clear from the fabrication discussion below.

Figure 7:
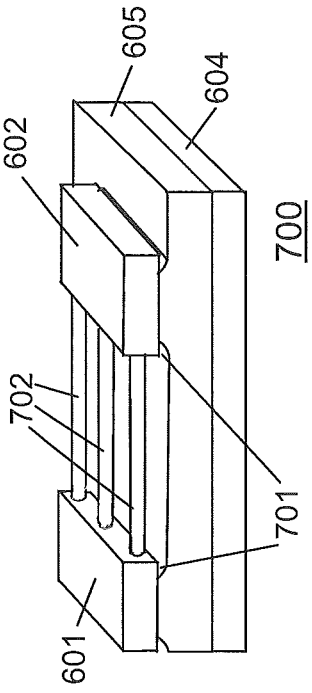
FIG. 7 illustrates a fabrication stage 700 in which the nanowire structures 603 are etched into a substantially circular-cross-section shape.

In the fabrication stage 700 shown in FIG. 7, the third base portions 603 and an underlying portion 701 of the BOX layer 605 are etched to provide free-standing nanowires 702, each supported on each end by the first and second base portions 601,602. Such etching could use, for example, diluted hydrofluoric acid (DHF), and might etch an upper portion 701 of the substrate surface, including undercutting the first and second base portions 601,602 around the outer edges. If desired, the resultant nanowires 702 can be smoothed by annealing the nanowire structure 702 in a hydrogen atmosphere, as described in the above-mentioned '993 patent, so that the nanowire 702 is substantially circular in cross section, but such circular cross section is not critical to the present invention.

That is, the nanowire could have other cross-sectional shapes based upon the treatment of the third base portions 603, based on the amount of etching and the initial dimensions of the base portions 603. If the base portion 603 has approximately equal dimensions for height and width, and a smoothing step is included, then the resultant nanowire could be substantially circular in cross section. The smoothing could be achieved by, for example, an annealing process in hydrogen. If the base portion 603 has substantially different height/width dimensions, the cross-sectional shape would be more oval. If no smoothing procedure is used, the cross-sectional shape would be more irregular.

Figure 8:
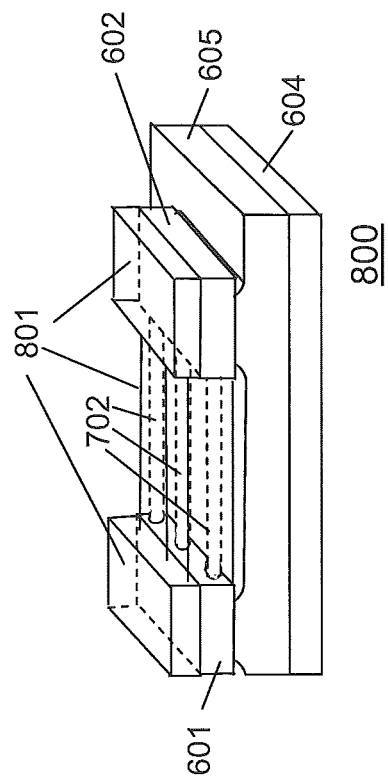
FIG. 8 illustrates a fabrication stage 800 in which a silicon layer 801 is deposited on a nanowire 601 and the source/drain regions.

In the fabrication stage 800 shown in FIG. 8, a film 801 of semiconductor material, such as silicon, is now deposited over the first and second base portions 601,602 and the nanowire structures 702, thereby increasing the diameter of the nanowires 702. Based on the above comment that higher Ge content will etch faster, it is noted that Si is exemplarily used in this discussion because it has a slower etch rate compared to SiGe, so that the original third base portions 603 can be selectively etched out from their two ends to thereby form a channel structure of Si with a hollow core.

Figure 9:
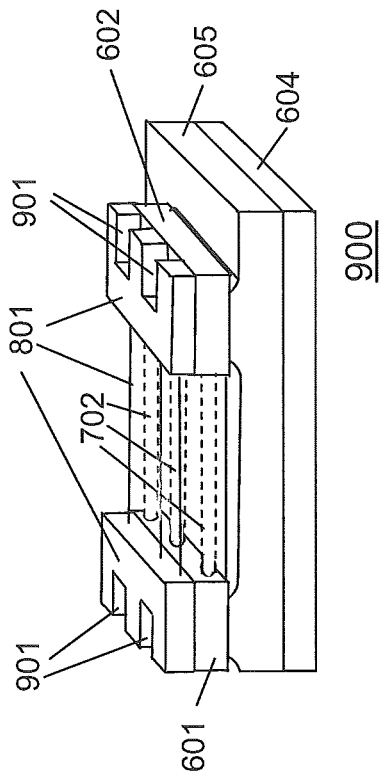
FIG. 9 illustrates a fabrication stage 900 in which portions of the source/drain regions 801 are etched to form openings 901 to the underlying SiGe layer so that the nanowire cores can be etched out.

In the fabrication stage 900 shown in FIG. 9, openings 901 in the Si layer 801 of each of the first and second base portions, to expose the underlying SiGe layer 601,602 at each end of the nanowire structure. Thus, these openings provide an etchant access to the underlying SiGe layer that will more readily etch than the Si layer 801, thereby the internal core of SiGe in the nanotube structures 702 can be etched out, leaving a cavity inside the outer layer of Si.

FIGS. 10A shows a top view of the fabrication process at this stage, with FIG. 10B showing a longitudinal cross-sectional view through the outer two of the nanowire structures (cross section 1), and FIG. 10C showing a longitudinal cross-sectional view through the center nanowire structure (cross section 2). FIG. 10D shows the lateral cross-sectional view through two nanowire structures (cross section 3).

In fabrication stage 1100 shown in FIG. 11, a wet etching has been performed, to selectively etch away the SiGe at the openings of the first and second base portions 601 and 602 and continuing into the SiGe core 702 of the nanowire structure, thereby removing the SiGe nanowire core 702 via the two ends of the nanowire structure.

This wet etching is then followed by a deposition of electrode material 1101, such as polysilicon or W, again using the etched-out ends of the outer nanowire structures as the entry point for the electrode material 1101 into the etched-out cores of the three nanowire structures. This deposited electrode material 1101 is illustrated in the cross sectional view of FIGS. 11B-11D.

FIG. 12A shows a top view 1200 of the device when the deposited electrode material 1101 has been then polished down to expose the upper surface 801 of the source/drain regions, using, for example, a CMP (chemical-mechanical polishing). This step levels the deposited electrode layer 1101 and exposes the underlying Si layer 801. FIGS. 12B and 12C show longitudinal cross-sectional views and FIG. 12D shows a lateral cross-sectional view of two of the nanowire structures.

FIG. 13A shows a top view 1300 of the next stage of fabrication in which a standard gate structure is now formed over the three nanowire structures, using a sequence well known in the art in which the gate region 1304 is isolated by lithography so that the remaining electrode material around the nanowire structure in the gate region 1304 can be etched away down to the substrate, and then depositing in sequence a first insulating film 1301, such as SiO2, to surround the channel layer 1302 and serve as the gate dielectric layer, followed by formation of one or more gate films 1303, such as by deposition of amorphous silicon or a metal such as aluminum, around the gate dielectric layer 1301. Cross-sectional views are shown in FIGS. 13B, 13C, and 13D.

FIGS. 14A-14D shows top and cross-sectional views of an exemplary embodiment for the formation of the contacts for the device, with FIG. 14A showing a top view, FIG. 14B showing the formation of the backbias electrode contacts 1401 which is embedded in a dielectric layer 1404 such as silicon oxide layer, FIG. 14C showing the formation of the source/drain contacts 1402, and FIG. 14D showing the lateral cross-sectional view with gate electrode contacts 1403.

While the invention has been described in terms of several exemplary embodiments, those skilled in the art will recognize that the invention can be practiced with modifications. As examples of possible modifications, it is again noted that a finFET could be fabricated using the same fabrication steps described above for the nanowire. Other possible modifications include using a single-nanowire interconnected between the first and second base portions. Further, it is noted that, Applicants' intent is to encompass equivalents of all claim elements, even if amended later during prosecution.

What is claimed is:

1. A semiconductor device, comprising:
   a substrate;
   a source structure and a drain structure formed on said substrate;
   at least one nanowire structure interconnecting said source structure and said drain structure and serving as a channel therebetween; and
   a gate structure formed over said at least one nanowire structure to provide a control of a conductivity of carriers in said channel,
   wherein each of said at least one nanowire structure includes a center core serving as a backbias electrode for said channel.

2. The semiconductor device of claim 1, wherein said center core comprises a polysilicon.

3. The semiconductor device of claim 1, wherein said center core comprises a metal.

4. The semiconductor device of claim 3, wherein said metal comprises tungsten (W).

5. The semiconductor device of claim 1, further comprising:
   a film of insulation material having openings respectively over said source structure, said drain structure, said gate structure, and a contact with said center core; and
   a conductive material respectively filling said openings and respectively contacting said source structure, said drain structure, said gate structure, and said center core, to serve as electrical connections to the semiconductor device.

6. The semiconductor device of claim 1, wherein said at least one nanowire structure comprises a plurality of nanowire structures interconnecting between said source structure and said drain structure.

7. The semiconductor device of claim 1, wherein said channel comprises one of Si, SiGe, and Si/SiGe.

* * * * *